(12) United States Patent
Park et al.

(10) Patent No.: US 11,348,892 B2
(45) Date of Patent: May 31, 2022

(54) SEMICONDUCTOR DEVICES INCLUDING BONDING LAYER AND ADSORPTION LAYER

(71) Applicant: SAMSUNG ELECTRONICS CO., LTD., Suwon-si (KR)

(72) Inventors: Jaehyung Park, Anyang-si (KR); Seokho Kim, Hwaseong-si (KR); Hoonjoo Na, Seoul (KR); Kwangjin Moon, Hwaseong-si (KR); Kyuha Lee, Seongnam-si (KR); Joohee Jang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/854,114

(22) Filed: Apr. 21, 2020

(65) Prior Publication Data
US 2021/0057371 A1 Feb. 25, 2021

(30) Foreign Application Priority Data

Aug. 19, 2019 (KR) .................. 10-2019-0100753

(51) Int. Cl.
*H01L 27/30* (2006.01)
*H01L 23/00* (2006.01)
(Continued)

(52) U.S. Cl.
CPC .............. *H01L 24/32* (2013.01); *H01L 24/83* (2013.01); *H01L 27/286* (2013.01);
(Continued)

(58) Field of Classification Search
CPC ....... H01L 24/32; H01L 24/83; H01L 27/307; H01L 27/14665; H01L 27/14645; H01L 2224/83896; H01L 2224/32145; H01L 2224/32501; H01L 2224/83895; H01L 2224/0812; H01L 2224/08121; H01L 2224/08123; H01L 2224/08145; H01L 2224/80895; H01L 2224/80896; H01L 27/14634; H01L 27/1462; H01L 27/286; H01L 27/14636; H01L 2221/10402; H01L 2221/1047; H01L 2221/1057; H01L 2221/1073
(Continued)

(56) References Cited

U.S. PATENT DOCUMENTS 5,419,806 A * 5/1995 Huebner ................ H01L 23/48
216/18
8,163,373 B2 4/2012 Tong
(Continued)

FOREIGN PATENT DOCUMENTS

JP 5401661 B2 1/2014

*Primary Examiner* — Khiem D Nguyen
(74) *Attorney, Agent, or Firm* — Sughrue Mion, PLLC

(57) ABSTRACT

A semiconductor device includes a first adsorption layer, a first bonding layer, a second bonding layer, and a second adsorption layer stacked on a first substrate, and a conductive pattern structure penetrating through the first adsorption layer, the first bonding layer, the second bonding layer and the second adsorption layer. The first and second bonding layers are in contact with each other, and each of the first and second adsorption layers includes a low-K dielectric material.

19 Claims, 17 Drawing Sheets

(51) Int. Cl.
  *H01L 27/28* (2006.01)
  *H01L 27/146* (2006.01)

(52) U.S. Cl.
  CPC ...... *H01L 27/307* (2013.01); *H01L 27/14647* (2013.01); *H01L 2224/32145* (2013.01); *H01L 2224/32501* (2013.01); *H01L 2224/83359* (2013.01); *H01L 2224/83895* (2013.01); *H01L 2224/83896* (2013.01)

(58) Field of Classification Search
  USPC ......................................................... 257/777
  See application file for complete search history.

(56) References Cited

U.S. PATENT DOCUMENTS

| | | | |
|---|---|---|---|
| 8,916,449 B2 | 12/2014 | Yin et al. | |
| 8,956,958 B2 | 2/2015 | Baillin | |
| 9,257,399 B2* | 2/2016 | Kuang | H01L 24/10 |
| 9,312,229 B2 | 4/2016 | Chen et al. | |
| 9,520,361 B2* | 12/2016 | Kang | H01L 27/14621 |
| 9,640,510 B2 | 5/2017 | Rebhan | |
| 9,793,243 B2* | 10/2017 | Lu | H01L 23/528 |
| 9,960,142 B2 | 5/2018 | Chen et al. | |
| 10,020,283 B2* | 7/2018 | Baudin | H01L 21/187 |
| 10,068,876 B2* | 9/2018 | Kabe | H01L 24/80 |
| 10,090,351 B2* | 10/2018 | Ashidate | H01L 24/05 |
| 2013/0252399 A1* | 9/2013 | Leduc | H01L 21/187 |
| | | | 438/455 |
| 2013/0270328 A1* | 10/2013 | Di Cioccio | H01L 24/12 |
| | | | 228/176 |
| 2013/0285253 A1* | 10/2013 | Aoki | H01L 24/08 |
| | | | 257/774 |
| 2015/0108644 A1* | 4/2015 | Kuang | H01L 25/043 |
| | | | 257/751 |
| 2016/0155862 A1* | 6/2016 | Hong | H01L 24/29 |
| | | | 257/432 |
| 2016/0358828 A1* | 12/2016 | Ide | H01L 21/76256 |
| 2017/0170137 A1 | 6/2017 | Suganuma et al. | |

* cited by examiner

SEMICONDUCTOR DEVICES INCLUDING BONDING LAYER AND ADSORPTION LAYER

CROSS-REFERENCE TO THE RELATED APPLICATION

This application is based on and claims priority from Korean Patent Application No. 10-2019-0100753, filed on Aug. 19, 2019 in the Korean Intellectual Property Office, the disclosure of which is incorporated herein by reference in its entirety.

BACKGROUND

1. Field

Methods and apparatuses consistent with example embodiment of the inventive concept relate to a semiconductor device having an adsorption layer with a low dielectric constant material.

2. Description of the Related Art

A semiconductor device may be manufactured by bonding substrates on which conductive patterns are formed, respectively. However, voids may occur between bonding layers bonded to each other on the substrates, and thus, the substrates may not be properly bonded.

SUMMARY

Example embodiments of the inventive concept provide semiconductor devices having improved bonding characteristics.

According to example embodiments, there is provided a semiconductor device which may include: a first adsorption layer, a first bonding layer, a second bonding layer, and a second adsorption layer stacked on a first substrate; and a conductive pattern structure penetrating through the first adsorption layer, the first bonding layer, the second bonding layer and the second adsorption layer. The first and second bonding layers may be in contact with each other, and each of the first and second adsorption layers may include a low-K dielectric material.

According to example embodiments, there is provided a semiconductor device which may include: a first adsorption layer and a first bonding layer stacked on a substrate; a first conductive pattern penetrating through the first adsorption layer and the first bonding layer; a second bonding layer and a second adsorption layer stacked on the first bonding layer and the first conductive pattern; and a second conductive pattern extending through the second bonding layer and the second adsorption layer. The first and second bonding layers may be in contact with each other, and the first and second conductive patterns may be in contact with each other. Each of the first and second adsorption layers may include a low-κ dielectric material.

According to example embodiments, there is provided a semiconductor device which may include: a first structure including a first insulating interlayer, a first diffusion barrier layer, a first adsorption layer and a first bonding layer stacked on a substrate; a first conductive pattern penetrating through the first structure; a second structure including a second bonding layer, a second adsorption layer, a second diffusion barrier layer and a second insulating interlayer stacked on the first structure and the first conductive pattern; and a second conductive pattern penetrating through the second structure. The first and second bonding layers may be in contact with each other, and the first and second conductive patterns may be in contact with each other. Each of the first and second adsorption layers may include a low-K dielectric material, and may further include an air gap extending therethrough.

In a method of manufacturing a semiconductor device, an adsorption layer including a low-κ dielectric material may be further formed between an insulating interlayer and a bonding layer. Since the adsorption layer may have a lower density than the bonding layer, water molecules formed on a surface of the bonding layer may be penetrated into the adsorption layer, so that bonding strength of the bonding layer may be improved.

DESCRIPTION OF EMBODIMENTS

Figure 1:
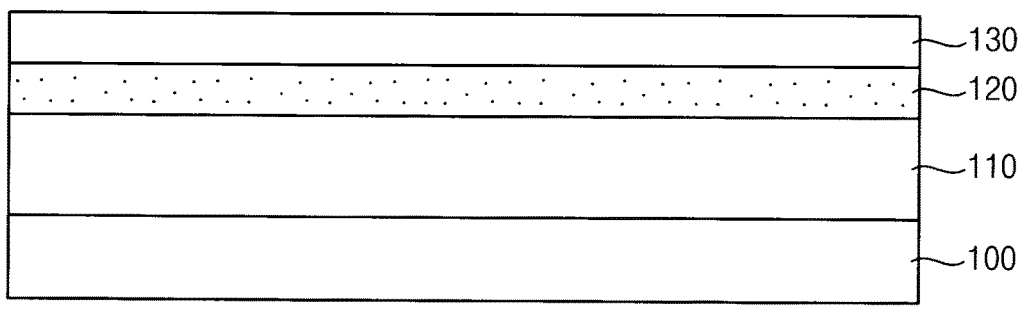
FIGS. 1 to 7 are cross-sectional views illustrating stages of a method of manufacturing a semiconductor device in accordance with example embodiments.

The embodiments described here below are all exemplary, and thus, the inventive concept is not limited to these embodiments disclosed below and may be realized in various other forms. An embodiment provided in the following description is not excluded from being associated with one or more features of another example or another embodiment also provided herein or not provided herein but consistent with the inventive concept. For example, even if matters described in a specific example are not described in a different example thereto, the matters may be understood as being related to or combined with the different example, unless otherwise mentioned in descriptions thereof.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. Like numerals refer to like elements throughout.

Spatially relative terms, such as "beneath," "below," "lower," "under," "on," "over," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Semiconductor devices and methods of manufacturing the same in accordance with embodiments will be described more fully hereinafter with reference to the accompanying drawings.

FIGS. 1 to 7 are cross-sectional views illustrating stages of a method of manufacturing a semiconductor device in accordance with embodiments.

Referring to FIG. 1, a first insulating interlayer 110, a first adsorption layer 120 and a first bonding layer 130 may be stacked on a first substrate 100.

The first substrate 100 may include semiconductor materials, e.g., silicon, germanium, silicon-germanium, etc., or III-V compounds e.g., GaP, GaAs, GaSb, etc., not being limited thereto. According to embodiments, the first substrate 100 may be a silicon-on-insulator (SOI) substrate or a germanium-on-insulator (GaI) substrate. According to an embodiment, the first substrate 100 may be doped with p-type impurities.

Although not shown, semiconductor elements such as transistors, contact plugs, wirings, capacitors, and the like may be formed on the first substrate 100.

The first insulating interlayer 110 may include an oxide, e.g., tetra ethoxysilane (TEOS), not being limited thereto.

The first adsorption layer 120 may include a material having a low dielectric constant, that is, a low-K dielectric material. The material included in the first adsorption layer 120 may be formed of at least one selected from the group consisting of SiOF (fluorous silica gel; FSG), SiCOH, hydrogen silsesquioxane (HSQ), methyl silsesquioxane (MSQ), poly(arylene ether)(PAE), polyimide, parylene-N, parylene-F, Teflon (polytetrafluoroethylene; PTFE), amorphous carbon, amorphous fluorocarbon, porous SiCOH, porous MSQ, and porous PAE.

The first bonding layer 130 may include a material such as silicon carbonitride (SiCN) or silicon oxide ($SiO_2$), not being limited thereto. According to embodiments, in the case that the first bonding layer 130 includes silicon carbonitride (SiCN), the first bonding layer 130 may have a thickness of about 500 Å or less, and in the case that the first bonding layer 130 includes silicon oxide ($SiO_2$), the first bonding layer 130 may have a thickness of about 1000 Å or less.

In embodiments, the first adsorption layer 120 may have a lower density than the first bonding layer 130. Also, the first adsorption layer 120 may have a smaller thickness than the first insulating interlayer 110.

Figure 2:
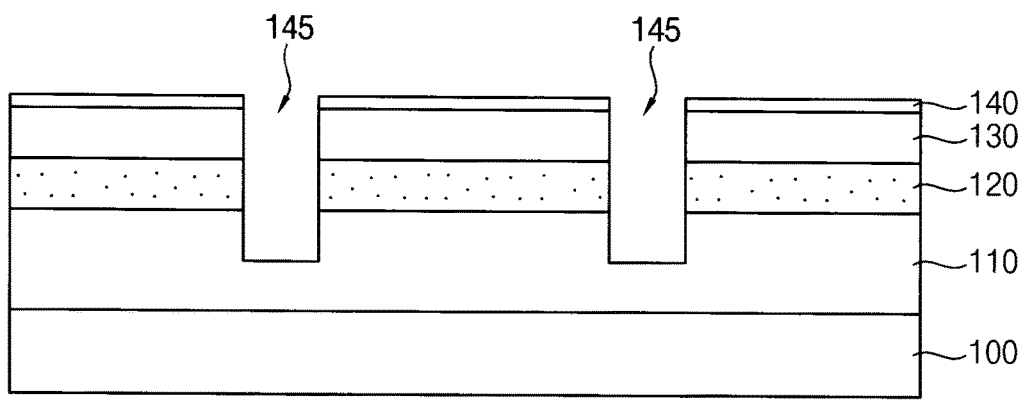

Referring to FIG. 2, a first etch stop layer 140 may be formed on the first bonding layer 130, and at least one first opening 145 may be formed to penetrate into an upper portion of the first insulating interlayer 110 through the first etch stop layer 140, the first bonding layer 130, and the first adsorption layer 120.

According to embodiments, the first etch stop layer 140 may include a nitride, e.g., silicon nitride (SiN) or silicon carbonitride (SiCN).

According to embodiments, a plurality of first openings 145 may be formed along a horizontal direction substantially parallel to an upper surface of the first substrate 100.

Figure 3:
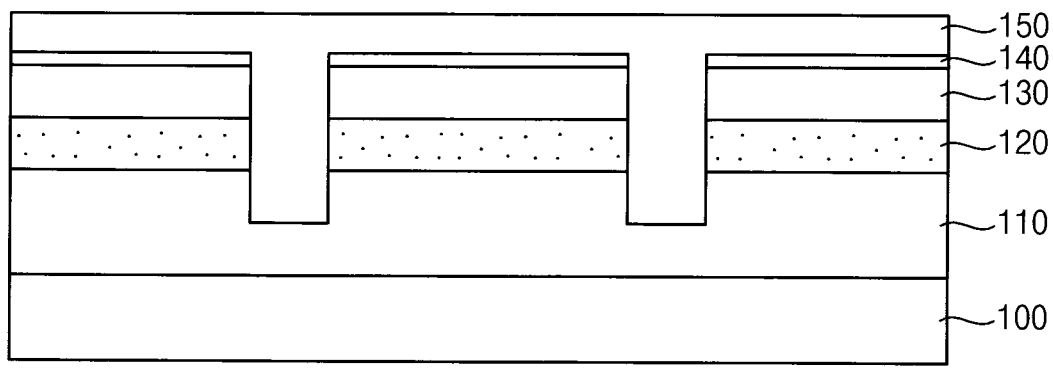

Referring to FIG. 3, a first conductive layer 150 filling the first opening 145 may be formed on the first etch stop layer 140.

The first conductive layer 150 may include a metal, e.g., tungsten, titanium, tantalum, etc.

Figure 4:
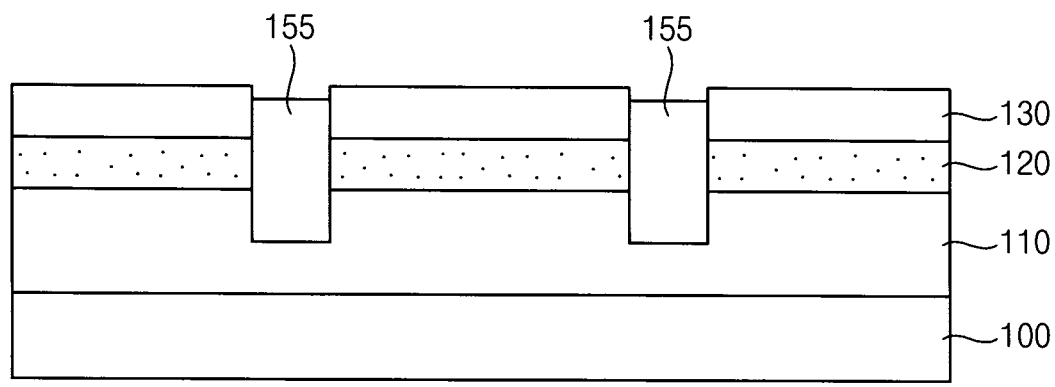

Referring to FIG. 4, a polishing process may be performed until an upper surface of the first bonding layer 130 may be exposed. Accordingly, the first conductive layer 150 may be transformed into a first conductive pattern 155 remaining on the first opening 145, and the first etch stop layer 140 may be removed.

According to an embodiment, an upper surface of the conductive pattern 155 may be formed lower than the upper surface of the first bonding layer 130.

According to embodiments, the polishing process may include a chemical mechanical polishing (CMP) process.

Figure 5:
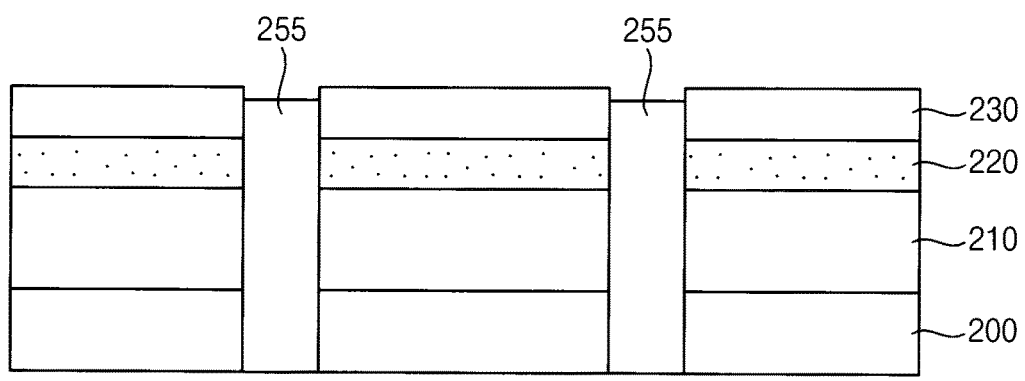

Referring to FIG. 5, processes substantially the same as or similar to the processes described with reference to FIGS. 1 to 4 may be performed.

In this process, a second insulating interlayer 210, a second adsorption layer 220 and a second bonding layer 230 may be stacked on a second substrate 200. Next, a second etch stop layer (not shown) may be formed on the second bonding layer 230, and at least one second opening may be formed to penetrate through the second etch stop layer, the second bonding layer 230, the second adsorption layer 220, the second insulating interlayer 210 and the second substrate 200. Further, a second conductive layer filling the second opening may be formed on the second etch stop layer followed by a polishing process performed until an upper surface of the second bonding layer 230 is exposed And then, a second conductive pattern 255 may be formed in the second opening, and the second etch stop layer may be removed.

FIG. 5 describes that the second opening penetrates through the second insulating interlayer 210 and the second substrate 200. However, the inventive concept may not be limited thereto. According to an embodiment, the second opening may be formed not to penetrate through the second insulating interlayer 210 and the second substrate 200, but to penetrate into only an upper portion of the second insulating interlayer 210.

According to embodiments, the second substrate 200, the second insulating interlayer 210, the second adsorption layer 220, the second bonding layer 230, the second etch stop layer and the second conductive layer may include substantially the same material as the first substrate 100, the first insulating interlayer 110, the first adsorption layer 120, the first bonding layer 130, the first etch stop layer 140 and the first conductive layer 150, respectively.

Accordingly, the second adsorption layer 220 may have a lower density than the second bonding layer 230, and may have a smaller thickness than the second insulating interlayer 210.

Figure 6:
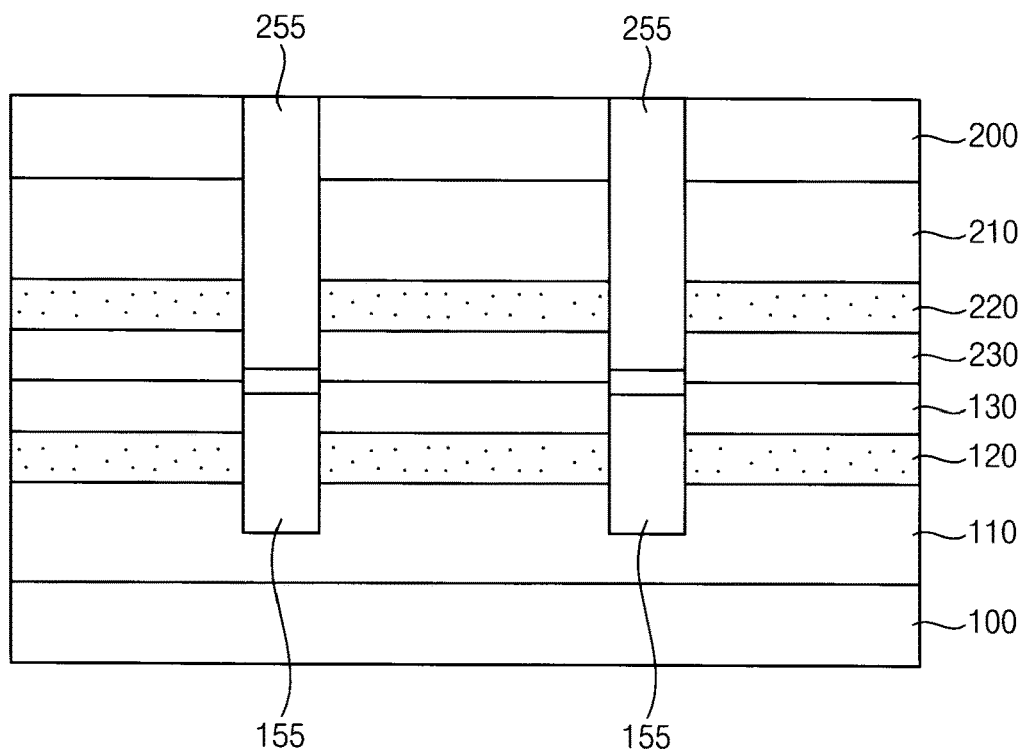

Referring to FIG. 6, after upending the second substrate 200 so that the second bonding layer 230 faces downward, the upended second substrate 200 may be disposed on the first substrate 100, and thus, the first and second bonding layers 130 and 230 may contact each other. The first conductive pattern 155 and the second conductive pattern 255 may not contact each other, but may be at least partially overlapped along a vertical direction substantially perpendicular to the upper surface of the first substrate 100.

FIG. 6 describes that each of a surface of the first bonding layer 130 opposite to the second substrate 200 and a surface of the second bonding layer 230 opposite to the first substrate 100 has a uniform surface, and all surfaces of the first and second bonding layers 130 and 230, except for portions thereof where the first and second conductive patterns 155 and 255, are formed to contact each other. However, the inventive concept is limited thereto. According to an embodiment, the surface of the first bonding layer 130 opposite to the second substrate 200 and/or the surface of the second bonding layer 230 opposite to the first substrate 100 may not have uniform surfaces, and in this case, the surfaces of the first and second bonding layers 130 and 230 may not partially contact each other.

Also, FIG. 6 describes that the first conductive pattern 155 and the second conductive pattern 255 exactly overlap each other in the vertical direction. However, the inventive concept may not be limited thereto. According to an embodiment, the first conductive pattern 155 and the second conductive pattern 255 may only partially overlap in the vertical direction.

According to an embodiment, an empty space may be formed between the first conductive pattern 155 and the second conductive pattern 255, and gases may be trapped in the empty space.

Figure 7:
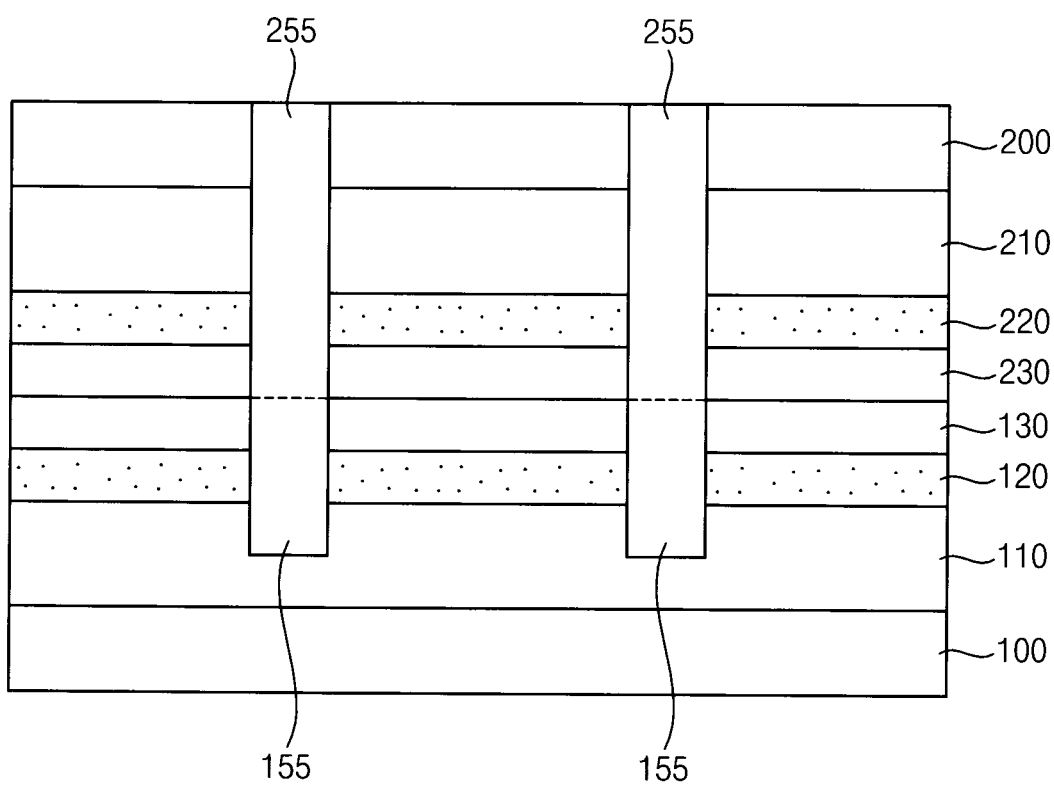

Referring to FIG. 7, a heat treatment process may be performed between the first substrate 100 and the second substrate 200, and the first and second substrates 100 and 200 may be bonded to each other.

Accordingly, the first bonding layer 130 on the first substrate 100 and the second bonding layer 230 on the upended second substrate 200 may be bonded and merged with each other. Also, each of the first conductive pattern 155 and the second conductive pattern 255 may be thermally expanded by the heat treatment process to increase its volume, and thus, may be bonded and merged with each other. The first and second conductive patterns 155 and 255 merged with each other altogether may form a first conductive pattern structure.

According to embodiments, the heat treatment process may be performed, e.g., at a temperature of about 400° C.

As described above, the first adsorption layer 120 may be formed under the first bonding layer 130 on the first substrate 100, and the first adsorption layer 120 may have a lower density than the first bonding layer 130, so that gases generated by the heat treatment process may penetrate through the first bonding layer 130, and may be adsorbed to the first adsorption layer 120.

Particularly, strong covalent bonds having a hydroxyl group (—OH) may be formed between silicon (Si) on the surface of the first bonding layer 130 and oxygen (O) atoms in the air, and water molecules may be formed by the hydroxyl group (—OH). When the water molecules are vaporized by the heat treatment process subsequently performed, the vaporized water molecules may penetrate through the first bonding layer 130 and may be absorbed into the first adsorption layer 120 by the density difference between the first bonding layer 130 and the first adsorption layer 120. Similar to the first substrate 100, the second adsorption layer 220 may be formed on the second bonding layer 230 on the upended second substrate 200, and the second adsorption layer 220 may have a lower density than the second bonding layer 230, so that gases generated by the heat treatment process may penetrate through the second bonding layer 230 and may be adsorbed to the second adsorption layer 220. Accordingly, the vaporized water molecules may not remain between the surface of the first bonding layer 130 opposite to the second substrate 200 and the surface of the second bonding layer 230 opposite to the first substrate 100, and thus a void may not be formed.

In addition, since gases of metal components trapped in the empty space between the first conductive pattern 155 and the second conductive pattern 255, or released as the first and second conductive patterns 155 and 255 are thermally expanded may also penetrate through the first and second bonding layers 130 and 230, and may be absorbed into the first and second adsorption layers 120 and 220, bonding strength of the first and second bonding layers 130 and 230 may be improved.

FIGS. 8 to 12 are and cross-sectional views illustrating stages of a method of manufacturing a semiconductor device in accordance with embodiments.

The method may include processes substantially the same as or similar to the processes described with reference to FIGS. 1 to 7, except that each of insulating interlayers corresponding to the first and second insulating interlayers 110 and 120 includes at least one air gap. Accordingly, duplicate descriptions thereon are omitted herein.

Figure 8:
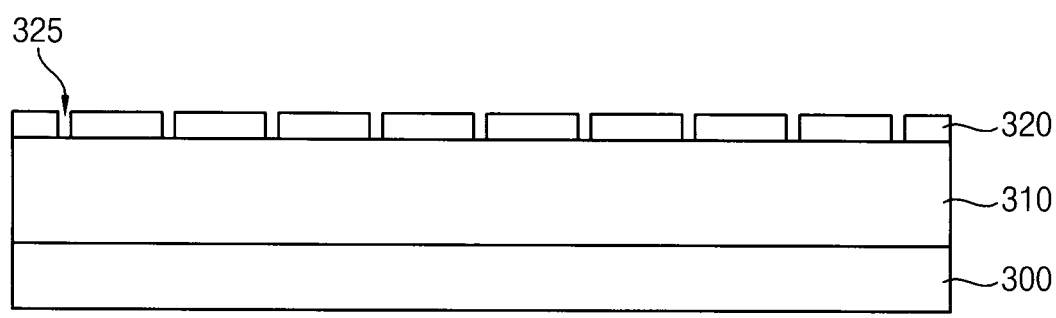
FIGS. 8 to 12 are and cross-sectional views illustrating stages of a method of manufacturing a semiconductor device in accordance with example embodiments.

Referring to FIG. 8, a third insulating interlayer 310 may be formed on a third substrate 300, and a first photoresist pattern 320 including at least one third opening 325 may be formed on the third insulating interlayer 310.

A plurality of third openings 325 may be formed along the horizontal direction, according to embodiments.

According to embodiments, the third opening 325 may have a circular shape or an elliptical shape in the plan view, and may have a circular pillar shape or an elliptical shape as a whole, not being limited thereto.

According to embodiments, the third insulating interlayer 310 may include the material substantially the same as the first and second insulating interlayers 110 and 210.

Figure 9:
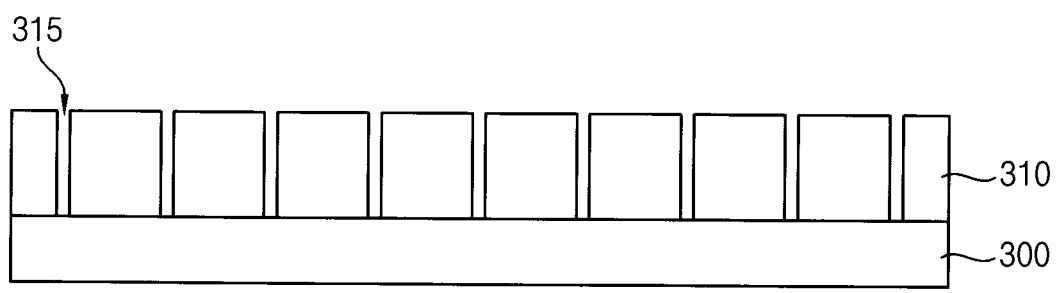

Referring to FIG. 9, the third insulating interlayer 310 may be etched by performing an etching process using the first photoresist pattern 320 as an etching mask, and thus, at least one fourth opening 315 may be formed on the third insulating interlayer 310.

A plurality of fourth openings 315 may be formed along the horizontal direction.

Figure 10:
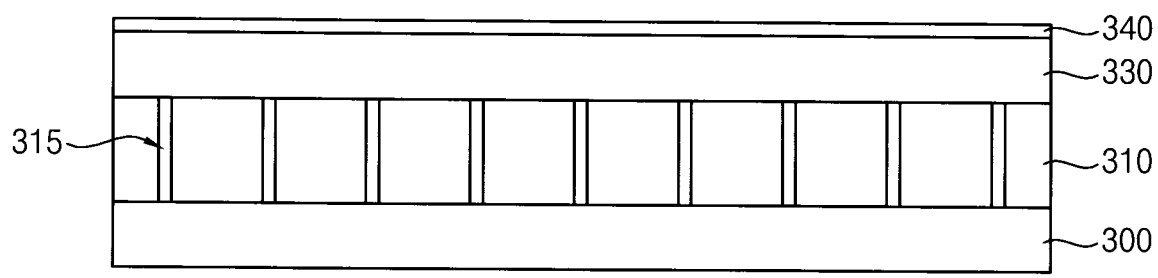

Referring to FIG. 10, a third bonding layer 330 and a third etch stop layer 340 may be stacked on the third insulating interlayer 310.

The fourth opening 315 may not be filled with the third bonding layer 330, and the fourth opening 315 will be referred to as at least one first air gap 315 hereinafter.

According to embodiments, the third bonding layer 330 may include substantially the same material as the first and second bonding layers 130 and 230, and the third etch stop layer 340 may include substantially the same material as the first etch stop layer 140 and the second etch stop layer.

Figure 11:
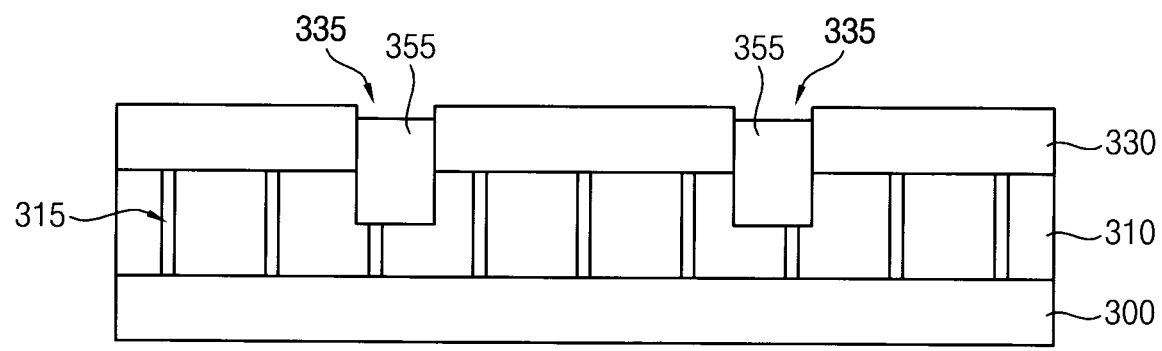

Referring to FIG. 11, processes substantially the same as or similar to the processes described with reference to FIGS. 2 to 4 may be performed.

At least one fifth opening 335 may be formed to penetrate through the third etch stop layer 340, the third bonding layer 330 and an upper portion of the third insulating interlayer 310. A third conductive layer filling the fifth opening 335 may be formed on the third etch stop layer 340. A polishing process may be performed until an upper surface of the third bonding layer 330 may be exposed. A third conductive pattern 355 may be formed in the fifth opening 335, and the third etch stop layer 340 may be removed.

FIG. 11 describes that the fifth opening 335 does not penetrate through the third insulating interlayer 310 and the third substrate 300, but penetrate into only the upper portion of the third insulating interlayer 310. However, the inventive concept may not be limited thereto, and the fifth opening 335 may penetrate through the third insulating interlayer 310 and the third substrate 300.

The fifth opening 335 may be formed to vertically overlap at least one of the first air gaps 315 on the third insulating interlayer 310 to be connected therewith. Accordingly, a lower surface of the third conductive pattern 355 formed in the fifth opening 335 may be exposed by the at least one of the first air gaps 315.

The third conductive layer may include substantially the same material as the first conductive layer 150 and the second conductive layer.

Figure 12:
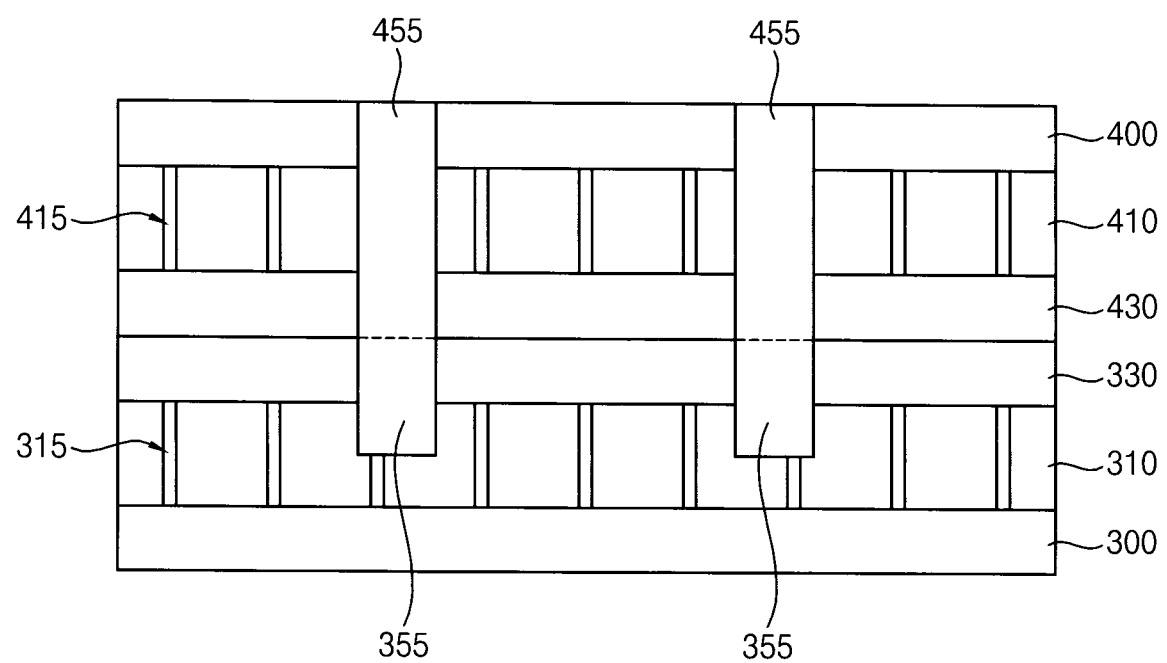

Referring to FIG. 12, after performing processes substantially the same as or similar to the processes described with reference to FIGS. 8 to 11, processes substantially the same as or similar to the processes described with reference to FIGS. 6 and 7 may be performed.

A fourth insulating interlayer 410 may be formed on a fourth substrate 400, and a second photoresist pattern (not shown) including at least one sixth opening (not shown) may be formed on the fourth insulating interlayer 410. The fourth insulating interlayer 410 may be etched by performing an etching process using the second photoresist pattern as an etching mask, and thus, at least one seventh opening (not shown) may be formed on the fourth insulating interlayer 410. A fourth bonding layer 430 and a fourth etch stop layer (not shown) may be stacked on the fourth insulating interlayer 410. The seventh opening may not be filled with the fourth bonding layer 430 and the fourth etch stop layer, the seventh opening will be referred to as at least one second air gap 415 hereinafter.

At least one eighth opening may be formed to penetrate through the fourth etch stop layer, the fourth bonding layer 430, the fourth insulating interlayer 410 and the fourth substrate 400, and a fourth conductive layer filling the eighth opening may be formed on the fourth etch stop layer. A polishing process may be performed until an upper surface of the fourth bonding layer 430 may be exposed. A fourth conductive pattern 455 may be formed in the eighth opening, and the fourth etch stop layer may be removed.

FIG. 12 describes that the eighth opening penetrates through the fourth insulating interlayer 410 and the fourth substrate 400. However, the inventive concept may not be limited thereto. The eighth opening may be formed not to penetrate through the fourth insulating interlayer 410 and the fourth substrate 400, but penetrate into only an upper portion of the fourth insulating interlayer 410.

After upending the fourth substrate 400 so that the fourth bonding layer 430 faces downward, the upended fourth substrate 400 may be disposed on the third substrate 300, and thus the third and fourth bonding layers 330 and 430 may contact each other. The third conductive pattern 355 and the fourth conductive pattern 455 may not contact each other, but may be at least partially overlapped along a vertical direction substantially perpendicular to the upper surface of the third substrate 300.

A heat treatment process may be performed between the third substrate 300 and the fourth substrate 400, and the third and fourth substrates 300 and 400 may be bonded to each other.

Accordingly, the third and fourth bonding layers 330 and 430 may be bonded and merged with each other. Also, each of the third and fourth conductive patterns 355 and 455 may be thermally expanded by the heat treatment process to increase its volume, and thus, may be bonded and merged with each other to form a second conductive pattern structure.

As described above, the first and second air gaps 315 and 415 may be formed in the third and fourth insulating interlayers 310 and 410 formed on the third and fourth substrates 300 and 400, respectively, so that gases generated by the heat treatment process may move into the first and second air gaps 315 and 415.

In addition, since gases of metal components trapped in the empty space between the third and fourth conductive patterns 355 and 455, or released as the third and fourth conductive patterns 355 and 455 are thermally expanded may be absorbed into the first and second air gaps 315 and 415, bonding strength of the third and fourth bonding layers 330 and 430 may be improved.

FIGS. 13 to 16 are and cross-sectional views illustrating semiconductor devices in accordance with embodiments.

The semiconductor devices are substantially the same as or similar to the semiconductor devices described with reference to FIGS. 7 and 12, except for some components. Accordingly, like reference numerals refer to like elements, and duplicate descriptions thereon are omitted herein.

Figure 13:
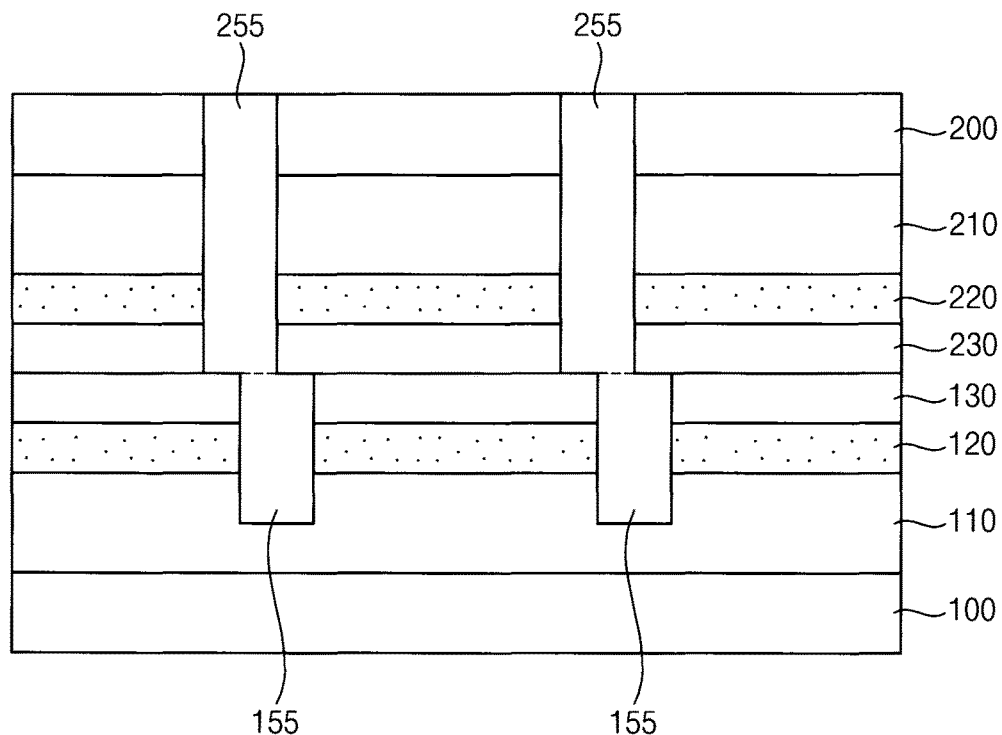
FIGS. 13 to 16 are and cross-sectional views illustrating semiconductor devices in accordance with example embodiments.

Referring to FIG. 13, an upper surface of the first conductive pattern 155 may contact a lower surface of the second conductive pattern 255 and a lower surface of the second bonding layer 230 together. This is because, when the second substrate 200 is upended so that the second bonding layer 230 faces downward, and the upended second substrate 200 is disposed on the first substrate 100, the first conductive pattern 155 formed on the first substrate 100 and the second conductive pattern 255 formed to penetrate through the upended second substrate 200 are not completely overlapped with each other, but are partially overlapped in the vertical direction. Accordingly, after performing the heat treatment process, the upper surface of the first conductive pattern 155 and the lower surface of the second conductive pattern 255 may be partially in contact with each other instead of being entirely in contact with each other.

Although not shown in FIG. 13, at least one of the first and second interlayer insulating layers may have at least one air gap such as the air gaps 315 and/or 415 shown in FIG. 12 to increase bonding strength of the first and second bonding layers 130 and 230, according to an embodiment.

Figure 14:
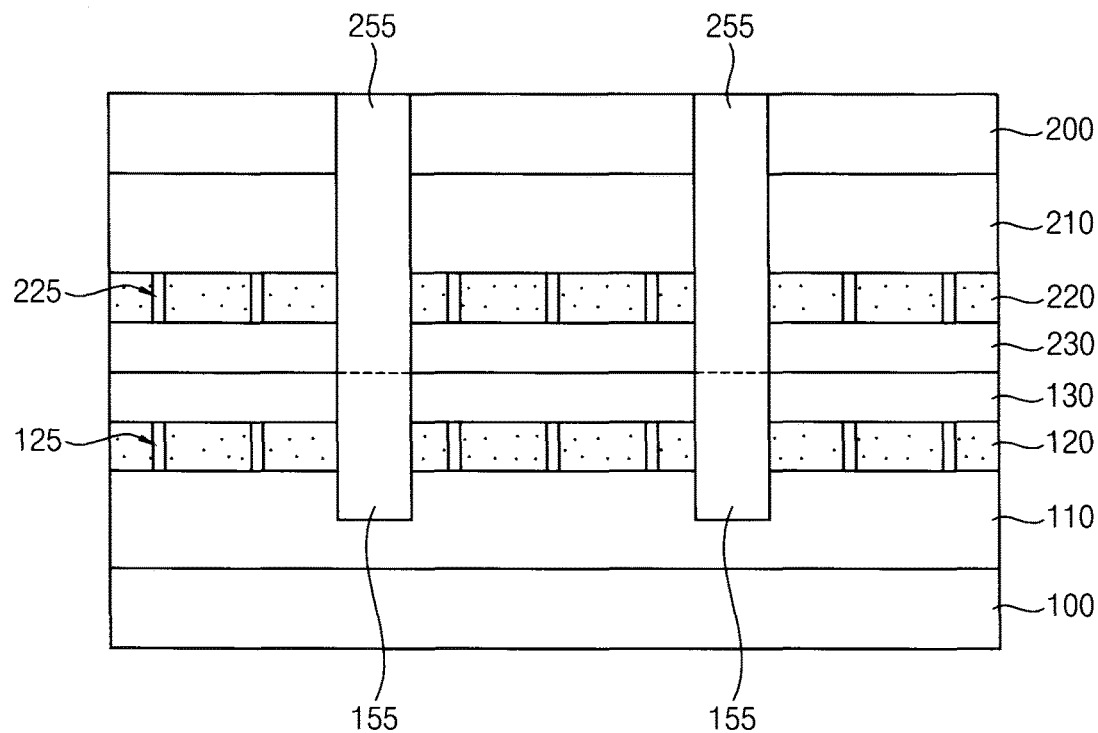

Referring to FIG. 14, the first and second adsorption layers 120 and 220 may include at least one third air gap 125 and at least one fourth air gap 225 penetrating through them, respectively.

Accordingly, the first and second adsorption layers 120 and 220 may have a smaller density than when the third and fourth air gaps 125 and 225 are not formed as shown in FIG. 7, and gases generated by the subsequent heat treatment process may be better adsorbed to the first and second adsorption layers 120 and 220.

Figure 15:
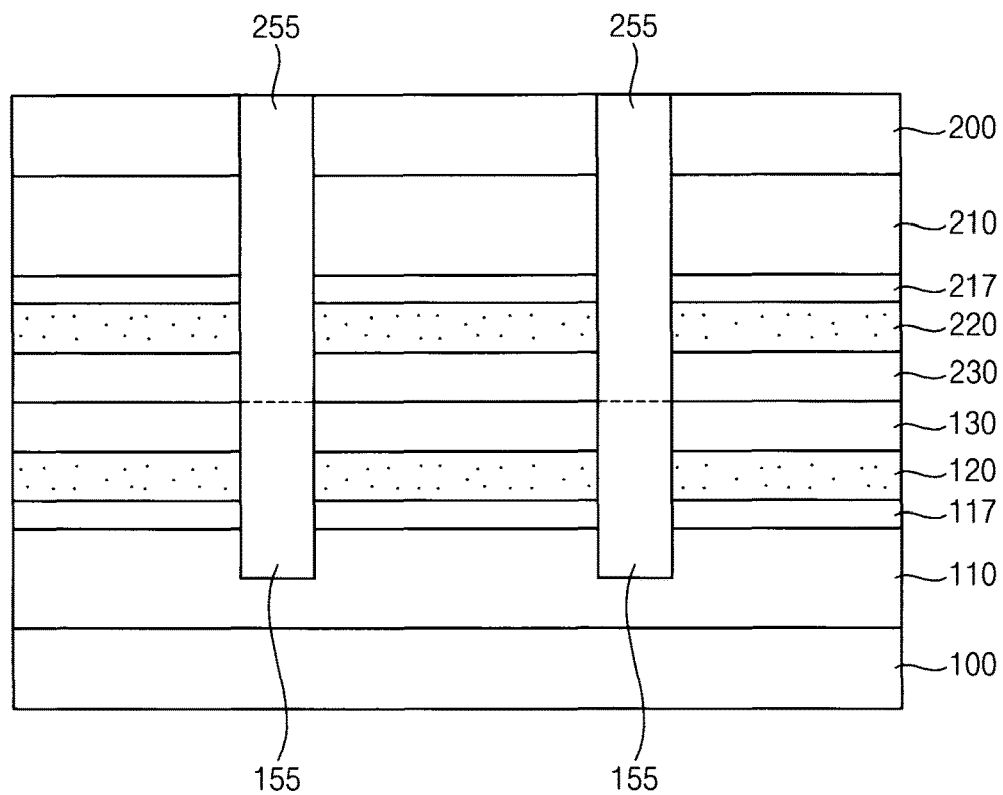

Referring to FIG. 15, a first diffusion barrier layer 117 may be further formed between the first insulating interlayer 110 and the first adsorption layer 120 on the first substrate 100, and a second diffusion barrier layer 217 may be further formed between the second insulating interlayer 210 and the second adsorption layer 220 on the second substrate 200. Thus gases absorbed into the first and second adsorption layers 120 and 220 may be prevented from being diffused into the first and second insulating interlayers 110 and 220 adjacent to them, respectively.

According to embodiments, each of the first and second diffusion barrier layers 117 and 217 may have a higher density than each of the first and second adsorption layers 120 and 220. According to an embodiment, the first and second diffusion barrier layers 117 and 217 may include substantially the same material as the first and second bonding layers 130 and 230. According to an embodiment, the first and second diffusion barrier layers 117 and 217 may include different material from the first and second bonding layers 130 and 230.

Figure 16:
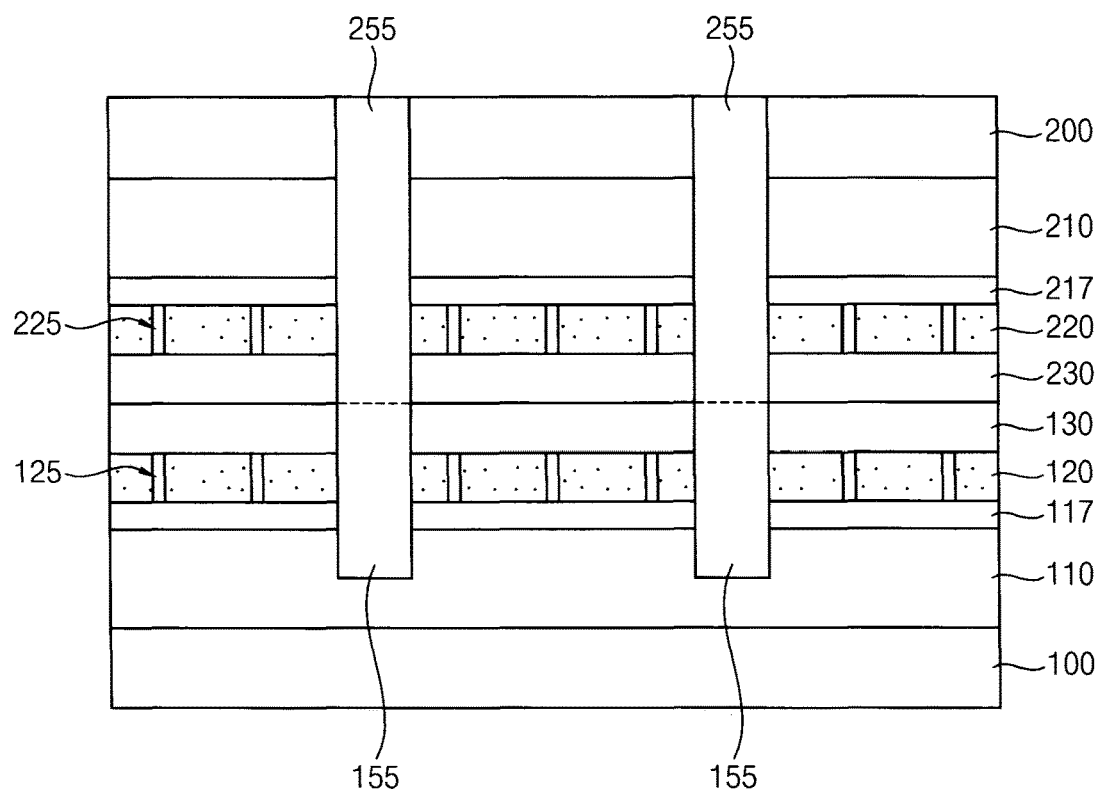

Referring to FIG. 16, the first and second adsorption layers 120 and 220 may include third and fourth air gaps 125 and 225 penetrating through them, respectively. Further, a first diffusion barrier layer 117 may be further formed between the first insulating interlayer 110 and the first adsorption layer 120 on the first substrate 100, and a second diffusion barrier layer 217 may be further formed between the second insulating interlayer 210 and the second adsorption layer 220 on the second substrate 200.

FIG. 16 illustrates that the first conductive pattern 155 is formed not to penetrate through the first insulating layer 110 and the first substrate 100. However, the inventive concept may not be limited thereto, and thus, the first conductive pattern 155 may be formed to penetrate through the first insulating layer 110, or the first insulating layer 110 and the first substrate 100.

FIGS. 17 to 26 are and cross-sectional views illustrating stages of a method of manufacturing an image sensor in accordance with embodiments.

The method may include processes substantially the same as or similar to the processes described with reference to FIGS. 1 to 7. Accordingly, like reference numerals refer to like elements, and duplicate descriptions thereon are omitted herein.

Hereinafter, two directions substantially parallel to an upper surface of a substrate and intersecting with each other are defined as first and second directions, respectively, and a direction substantially vertical to the upper surface of the substrate is defined as a third direction. According to embodiments, the first and second directions may be orthogonal to each other.

Figure 17:
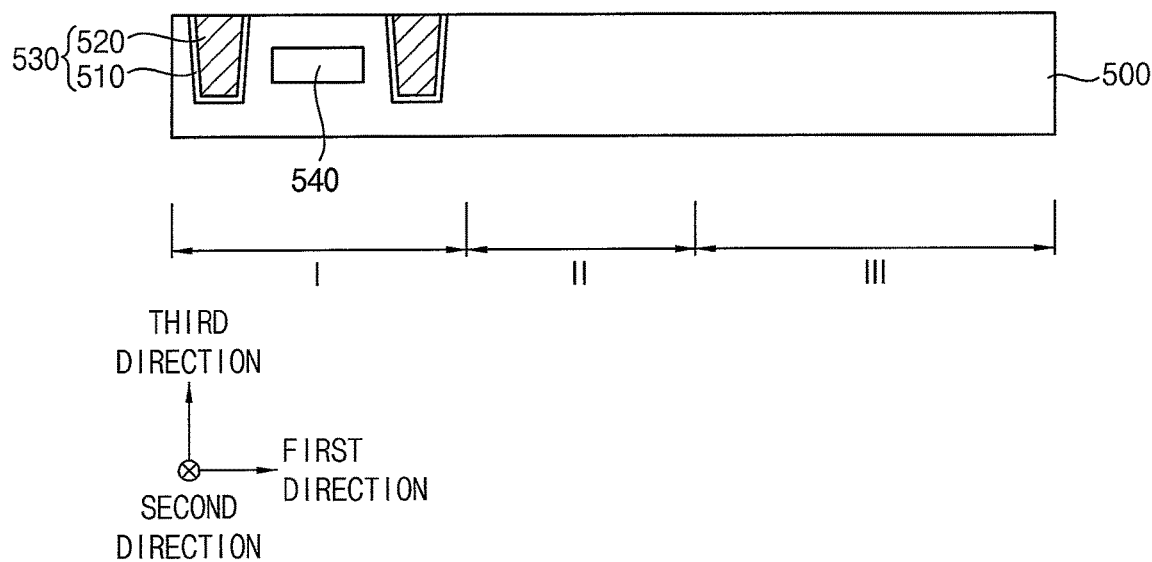
FIGS. 17 to 26 are and cross-sectional views illustrating stages of a method of manufacturing a semiconductor device, more specifically, an image sensor in accordance with example embodiments.

Referring to FIG. 17, at least one pixel isolation pattern (not shown), at least one through via 530 and at least one photodiode 540 may be formed in a fifth substrate 500 which includes first to third regions I, II and III.

The fifth substrate 500 may include substantially the same material as the first to fourth substrates 100, 200, 300 and 400. According to an embodiment, the fifth substrate 500 may be doped with p-type impurities.

According to embodiments, the first region I may be a region in which pixels may be formed, the second region II may be a region in which pads for inspecting the electrical characteristics of the pixels may be formed, and the third region III may be an input/output (I/O) region in which conductive structures for inputting/outputting electrical signals to/from the pixels may be formed. Hereinafter, the first to third regions I, II and III may be used as a concept including not only an inside of the fifth substrate 500, but also upper and lower spaces thereof.

The pixel isolation pattern and the through via 530 may be formed by forming first and second trenches extending in the third direction downwardly within the first region I of the fifth substrate 500, and filling the first and second trenches, respectively. The pixel isolation pattern and the through via 530 altogether may define a region in which a unit pixel may be formed, and a plurality of unit pixel regions may be arranged along each of the first and second directions within the first region I.

According to embodiments, the pixel isolation pattern may include e.g., an insulating material such as oxide or nitride, or a semiconductor material such as polysilicon According to other embodiments, the pixel isolation pattern may include, e.g., doped polysilicon, or a conductive material such as metal, metal nitride, etc.

The through via 530 may include a first insulation layer 510 on an inner wall of the second trench and a fifth conductive pattern 520 formed on the first insulation layer 510 to fill a remaining portion of the second trench.

According to embodiment, the photodiode 540 may have a structure in which first impurity region doped with an n-type impurity and a second impurity region doped with a p-type impurity may be stacked.

An isolation pattern (not shown), transistors (not shown) and a floating diffusion (FD) region (now shown) may be further formed at an upper portion of the fifth substrate 500. The transistors may include, e.g., a transfer transistor, a source follower transistor, a reset transistor, and a select transistor. The FD region may be doped with impurities of a conductivity type different from that of the fifth substrate 500, that is, an n-type impurity.

Figure 18:
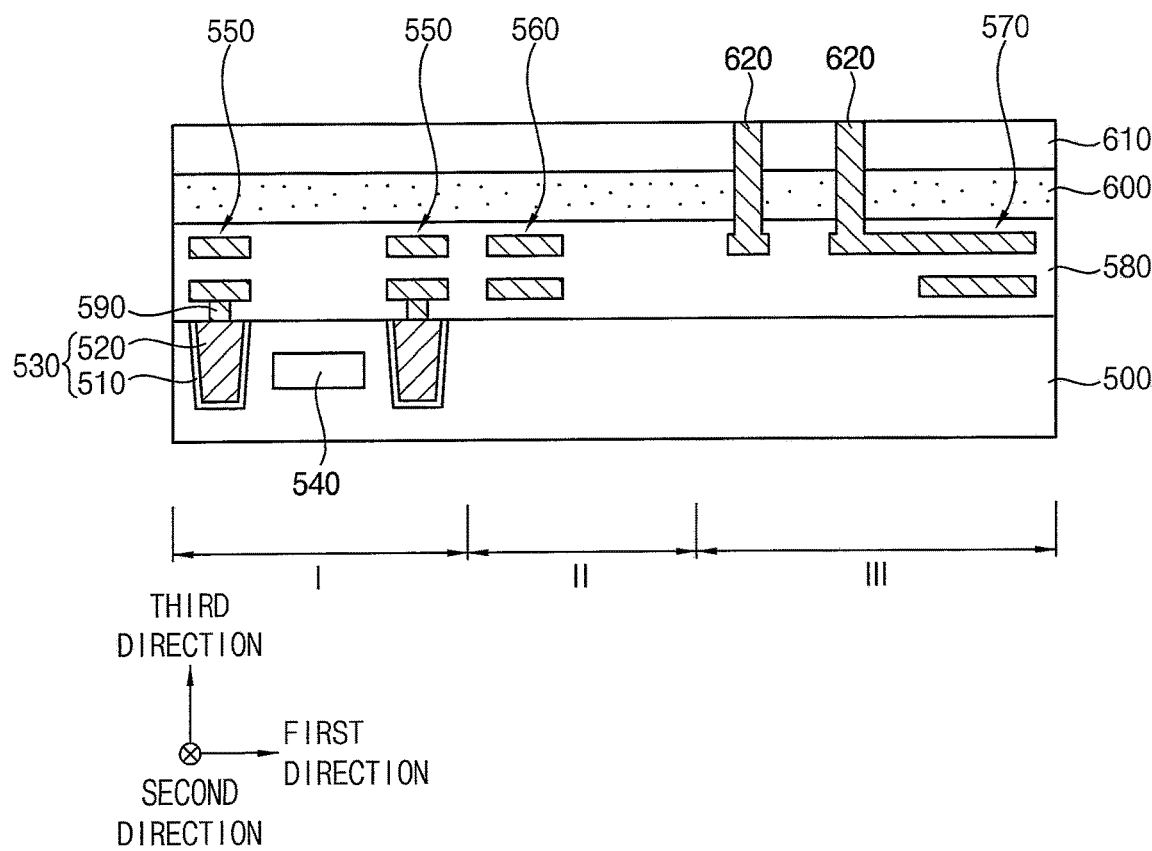

Referring to FIG. 18, a fifth insulating interlayer 580 containing at least one first wiring structure 550, at least one second wiring structure 560 and at least one third wiring structure 570 therein may be formed on the fifth substrate 500.

The first to third wiring structures 550, 560 and 570 may be formed in the first to third regions I, II and III, respectively. According to embodiments, the first wiring structure 550 may be formed to overlap the through via 530 and/or the pixel isolation pattern in the third direction. However, the inventive concept may not be limited thereto, and may be formed in various different layouts.

Also, each of the first to third wiring structures 550, 560 and 570 may be formed at a plurality of levels. The first to third wiring structures 550, 560 and 570 may be electrically connected with one another through first vias (not shown) formed in the fifth insulating interlayer 580. According to embodiments, the first to third wiring structures 550, 560 and 570 and the first vias may be formed by a dual damascene process or a single damascene process.

According to embodiments, the through via 530 may be electrically connected to the first wiring structure 550 through a first contact plug 590 in the fifth insulating interlayer 580. The FD region may also be electrically connected to the first wiring structure 550 through a second contact plug (now shown) in the fifth insulating interlayer 580.

After stacking a fifth adsorption layer 600 and a fifth bonding layer 610 on the fifth insulating interlayer 580, processes substantially the same as or similar to the processes described with reference to FIGS. 2 to 4 may be performed to form a sixth conductive pattern 620 penetrating through the fifth adsorption layer 600 and the fifth bonding layer 610 and being electrically connected to the third wiring structure 570.

Figure 19:
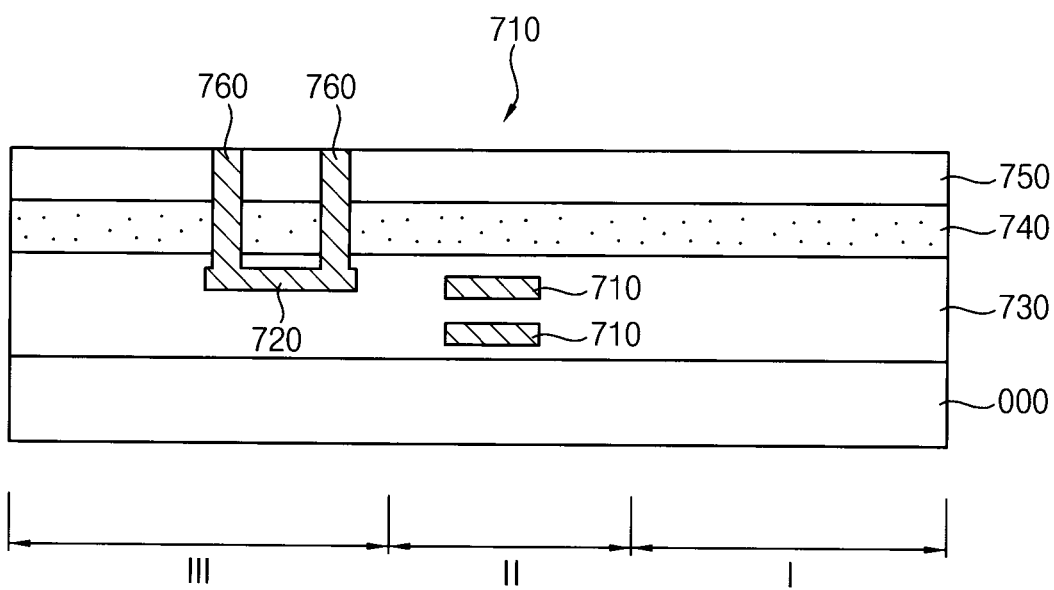
Figure 19:
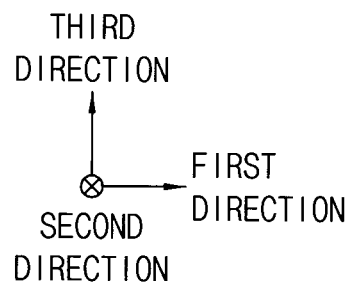

Referring to FIG. 19, a sixth insulating interlayer 730 containing at least one fourth wiring structure 710 and at least one fifth wiring structure 720 therein may be formed on a sixth substrate 700.

The fourth and fifth wiring structures 710 and 720 may be formed in the second and third regions II and III, respectively. Each of the fourth and fifth wiring structures 710 and 720 may be formed at a plurality of levels. The fourth and fifth wiring structures 710 and 720 may be electrically connected with each other through second vias (not shown)

formed in the sixth insulating interlayer 730. According to embodiments, the fourth and fifth wiring structures 710 and 720 and the second vias may be formed by a dual damascene process or a single damascene process.

After stacking a sixth adsorption layer 740 and a sixth bonding layer 750 on the sixth insulating interlayer 730, processes substantially the same as or similar to the processes described with reference to FIGS. 2 to 4 may be performed to form a seventh conductive pattern 760 penetrating through the sixth adsorption layer 740 and the sixth bonding layer 750 and being electrically connected to the fifth wiring structure 720.

Figure 20:
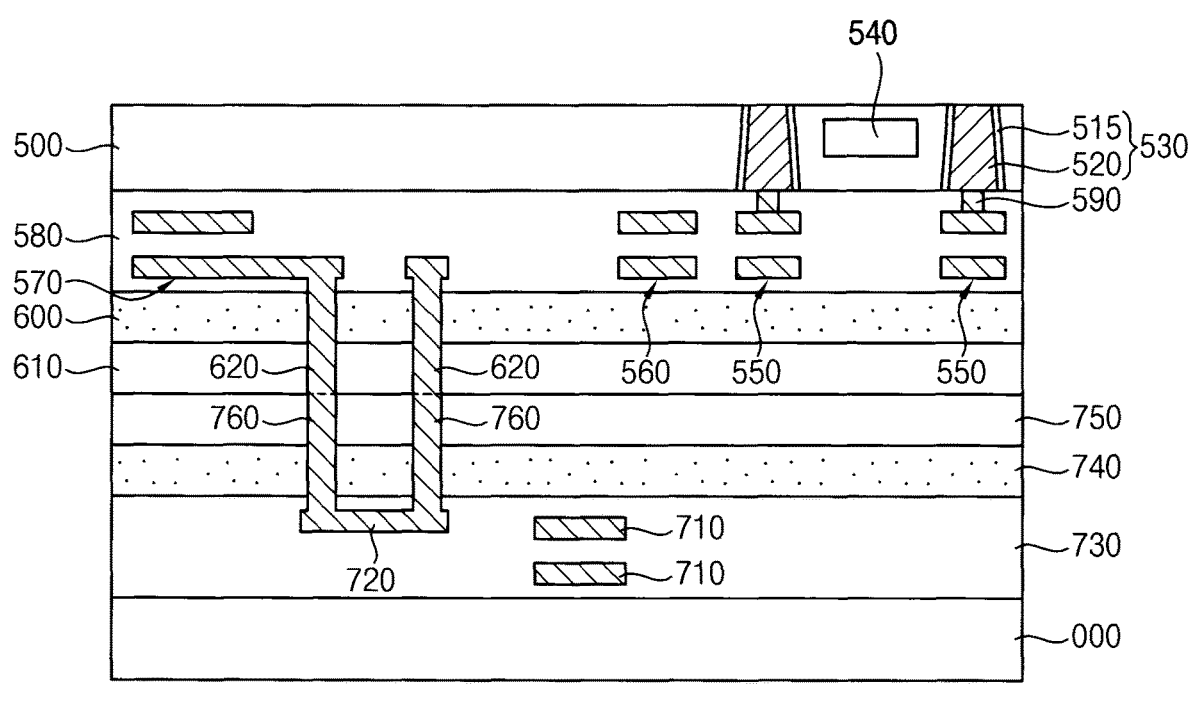
Figure 20:
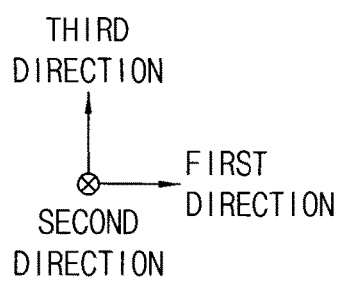

Referring to FIG. 20, by performing processes substantially the same as or similar to the processes described with reference to FIGS. 6 and 7, the fifth substrate 500 may be upended so that the fifth bonding layer 610 faces downward, and the fifth and sixth bonding layers 610 and 750 may contact each other. An upper portion of the upended fifth substrate 500 may be removed.

The sixth conductive pattern 620 and the seventh conductive pattern 760 may be disposed to be overlapped with each other, and may be thermally expanded to contact each other by a heat treatment process. Accordingly, the sixth and seventh conductive patterns 620 and 760 may be electrically connected with each other, and the third and fifth wiring structures 570 and 720 electrically connected to them, respectively, may also be electrically connected with each other.

According to embodiments, the upper portion of the upended fifth substrate 500 may be removed by a polishing process, e.g., a grinding process. Accordingly, the pixel isolation pattern and the through via 530 may be exposed.

Particularly, a portion of the first insulation layer 510 covering an upper surface of the fifth conductive pattern 520 in the through via 530 may be also removed by the polishing process to form a first insulation pattern 515. Accordingly, the through via 530 may include the fifth conductive pattern 520 and the first insulation pattern 515 covering a sidewall of the fifth conductive pattern 520.

Figure 21:
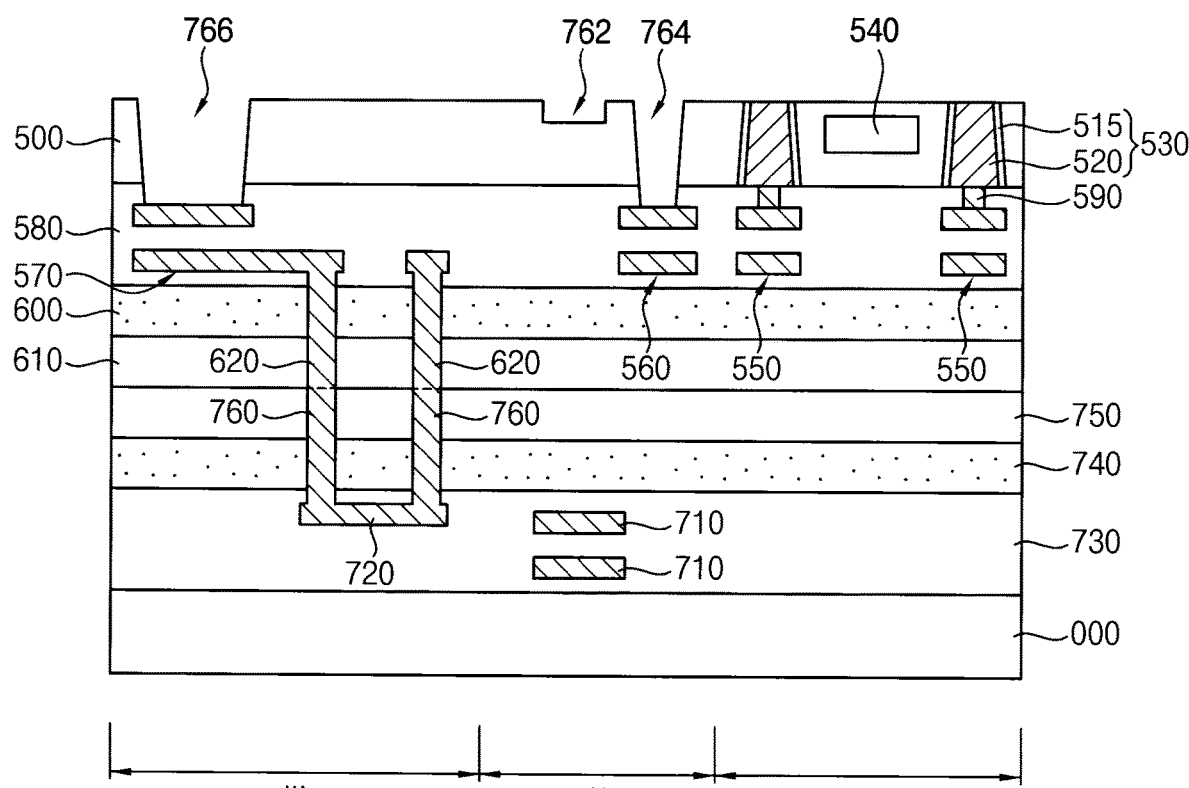
Figure 21:
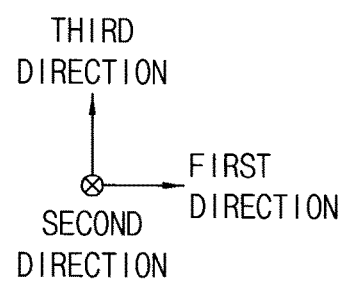

Referring to FIG. 21, a third trench 762 penetrating into an upper portion of the fifth substrate 500 adjacent to the through via 530, a fourth trench 764 adjacent to the third trench 762 and penetrating through the fifth substrate 500 to expose the second wiring structure 560, and a fifth trench 766 penetrating through the fifth substrate 500 and into the fifth insulating interlayer 580 to expose the third wiring structure 570 may be formed.

The third to fifth trenches 762, 764 and 766 may be formed on the upper portion of the fifth substrate 500 by forming an etching mask, e.g., a photoresist pattern and performing a dry etching process using the etching mask. The third and fourth trenches 762 and 764 may be formed in the second region II, and the fifth trench 766 may be formed in the third region III.

According to embodiments, the fifth trench 766 may have a greater width than that of the fourth trench 764.

Figure 22:
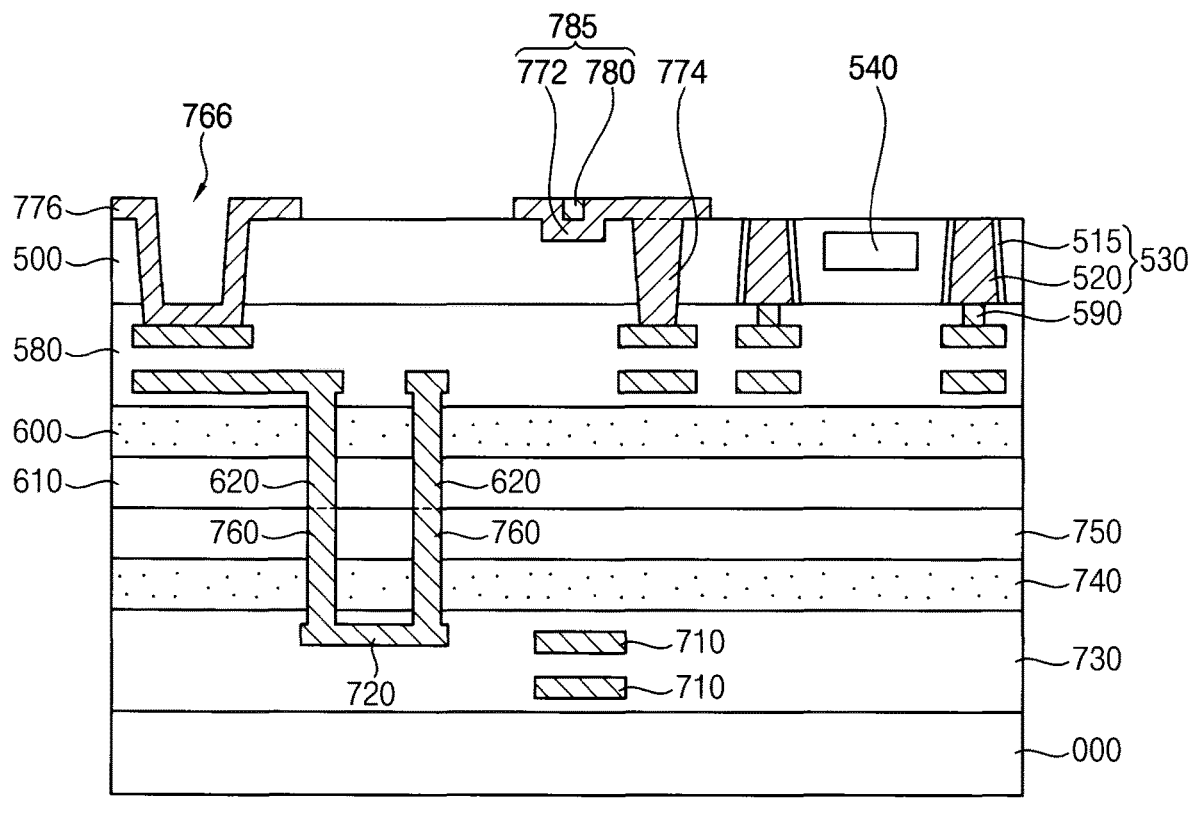

Referring to FIG. 22, an eighth conductive pattern 772 may be formed on the fifth substrate 500 to fill the third trench 762, and a third via 774 may be formed to fill the fourth trench 764 and contact a lower surface of the eighth conductive pattern 772 extended over the fourth trench 764. FIG. 22 further shows that a fourth via 776 may be formed on an inner wall of the fifth trench 766 and the fifth substrate 500.

The eighth conductive pattern 772 may fill the third trench 762, and may be formed on the fifth substrate 500 adjacent thereto. The third via 774 may fill the fourth trench 764, and may contact the second wiring structure 560 thereunder and the eighth conductive pattern 772 thereon.

According to embodiments, the eighth conductive pattern 772 may include a metal, e.g., tungsten, titanium, tantalum, etc.

A portion of the eighth conductive pattern 772 filling in the third trench 762 may have a concave upper surface depending on the depth of the third trench 762, and a ninth conductive pattern 780 may be further formed on the concave upper surface of the eighth conductive pattern 772. Accordingly, the eighth and ninth conductive patterns 772 and 780 may form a pad 785.

According to an embodiment, the ninth conductive pattern 780 may include a metal, e.g., aluminum.

Figure 23:
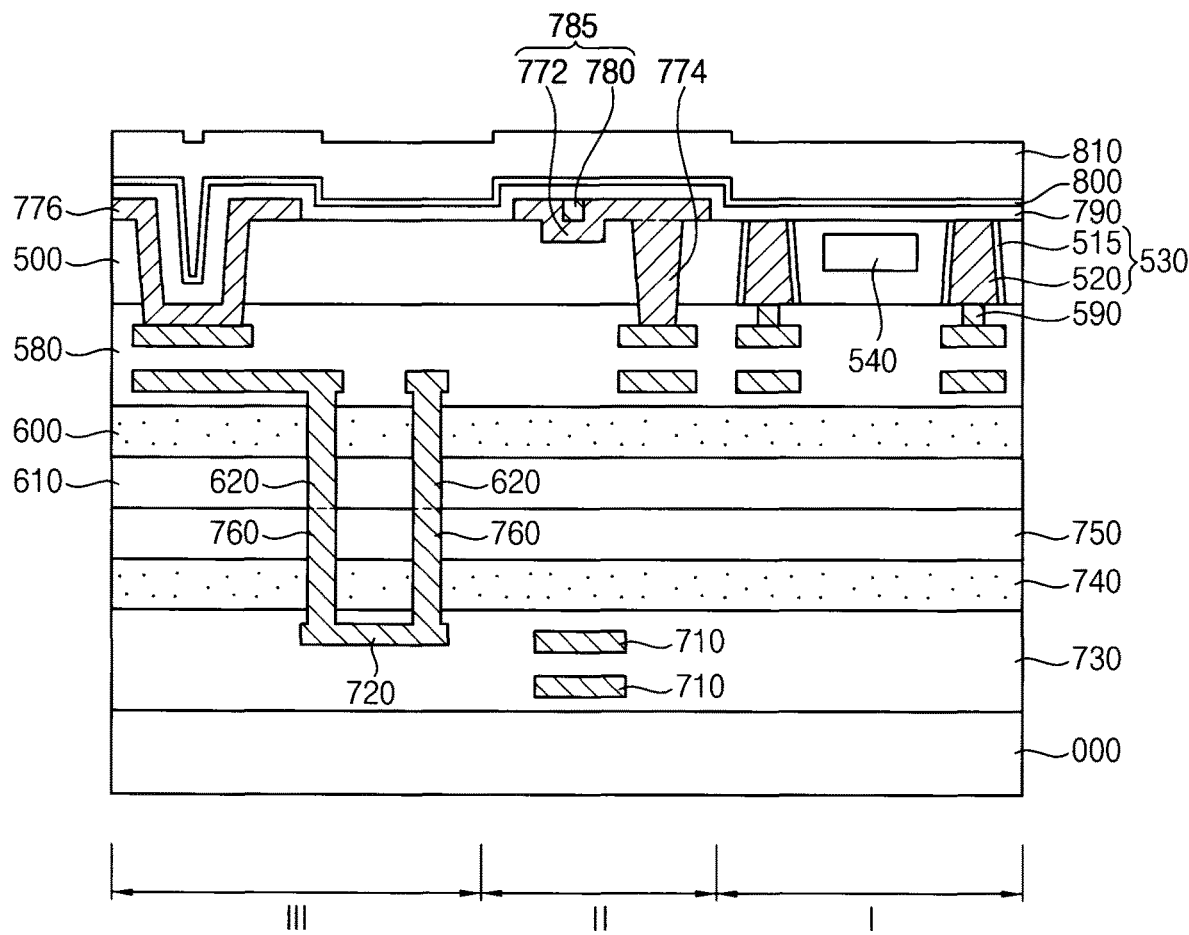

Referring to FIG. 23, after forming a seventh insulating interlayer 790 on the fifth substrate 500 to cover the pad 785 and the fourth via 776, a polishing stop layer 800 and an eighth insulating interlayer 810 may be formed on the seventh insulating interlayer 790.

According to embodiments, the seventh insulating interlayer 790 may not entirely fill the fifth trench 766, and thus may have a concave upper surface in the fifth trench 766. Also, the seventh insulating interlayer 790 may have a convex upper surface on the pad 785 on the fifth substrate 500. Accordingly, the seventh insulating interlayer 790 may have a uneven upper surface rather than a flat, even surface.

Accordingly, the polishing stop layer 800 and the eighth insulating interlayer 810 stacked on an upper surface of the seventh insulating interlayer 790 may also have uneven upper surfaces rather than flat, even surfaces. The polishing stop layer 800 may be formed to have a thickness smaller than those of the seventh and eighth insulating interlayers 790 and 810, and thus, may be conformally formed on the seventh insulating interlayer 790 not to entirely fill the fifth trench 766. However, the eighth insulating interlayer 810 may be formed to have a sufficient thickness to entirely fill a remaining portion of the fifth trench 766.

According to embodiments, the polishing stop layer 800 may have a material having a high polishing selectivity with respect to the eighth insulating interlayer 810, e.g., a nitride such as silicon nitride (SiN), silicon oxynitride (SiON), etc., or a carbide such as silicon carbide (SiC), silicon oxycarbide (SiOC), etc.

Figure 24:
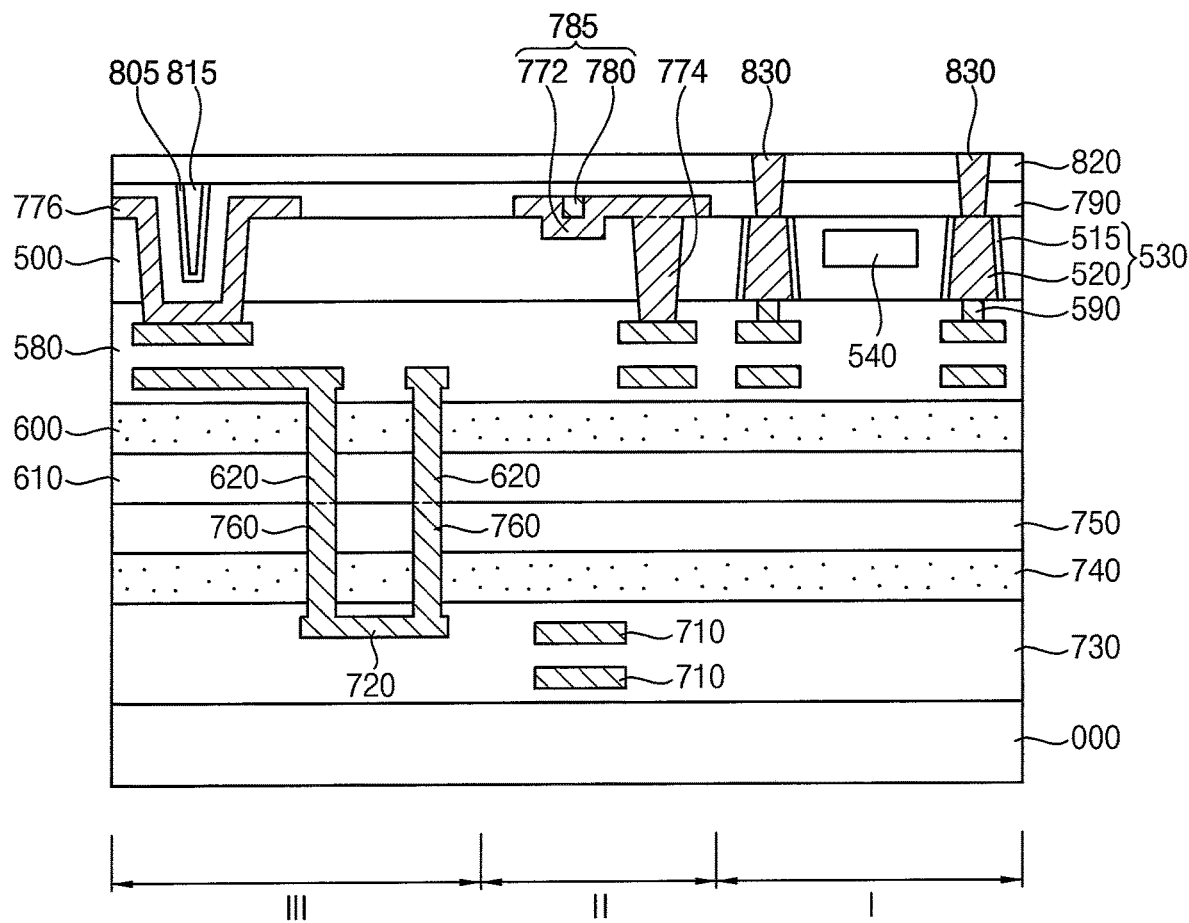
Figure 24:
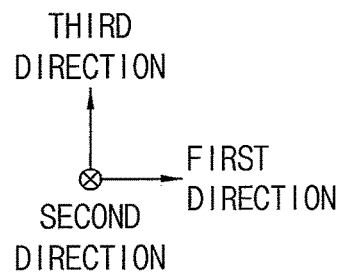

Referring to FIG. 24, a polishing process may be performed on the eighth insulating interlayer 810 until the polishing stop layer 800 may be exposed.

The polishing stop layer 800 may have the uneven upper surface, and thus, after the polishing process, the eighth insulating interlayer 810 may not be entirely removed, but a portion thereof may remain on the polishing stop layer 800.

Until the polishing stop layer 800 except for a portion thereof in the fifth trench 766 may be entirely removed, the polishing stop layer 800, the remaining portion of the eighth insulating interlayer 810, and the seventh insulating interlayer 790 may be removed.

After the polishing process, in addition to the fourth via 776 and the seventh insulating interlayer 790, the polishing stop layer 800 and the eighth insulating interlayer 810 may remain to form a polishing stop pattern 805 and a second insulation pattern 815, respectively, in the fifth trench 766.

After forming a ninth insulating interlayer 820 on the seventh insulating interlayer 790, the polishing stop pattern 805 and the second insulation pattern 815, at least one third contact plug 830 may be formed through the seventh and ninth insulating interlayers 790 and 820 to contact the through via 530.

Figure 25:
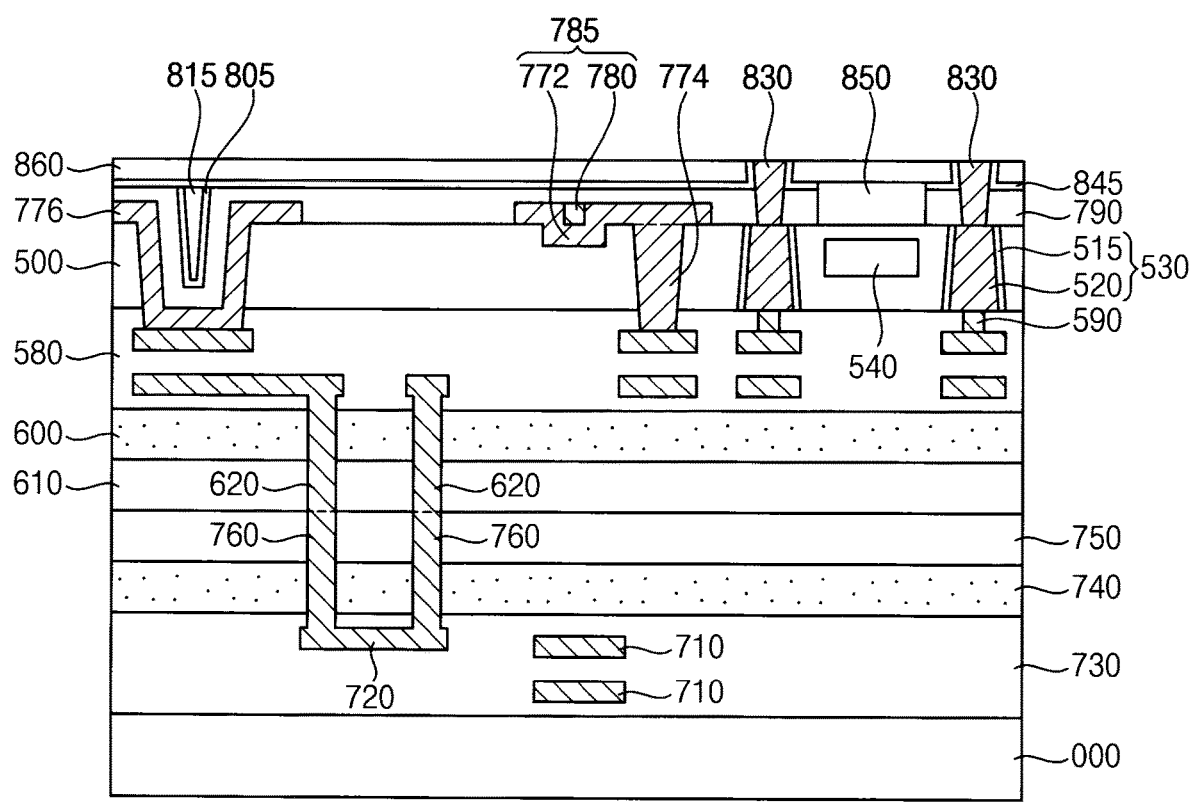

Referring to FIG. 25, after removing the ninth insulating interlayer 820 to expose upper surfaces of the seventh insulating interlayer 790, the polishing stop pattern 805 and the second insulation pattern 815, and an upper portion of the third contact plug 830, a third insulation pattern 845 may be formed thereon.

A color filter 850 may be formed through the third insulation pattern 845 and the seventh insulating interlayer 790. According to embodiments, the color filter 850 may be formed within the unit pixel region defined by the pixel isolation pattern and the through via 530, and may not overlap the pixel isolation pattern and the through via 530 in the third direction.

According to embodiments, the color filter 850 may be a red filter or a blue filter.

After forming a fourth insulation layer 860 on the third insulation pattern 845 and the color filter 850, the fourth insulation layer 860 may be planarized until an upper surface of the third contact plug 830 may be exposed.

Figure 26:
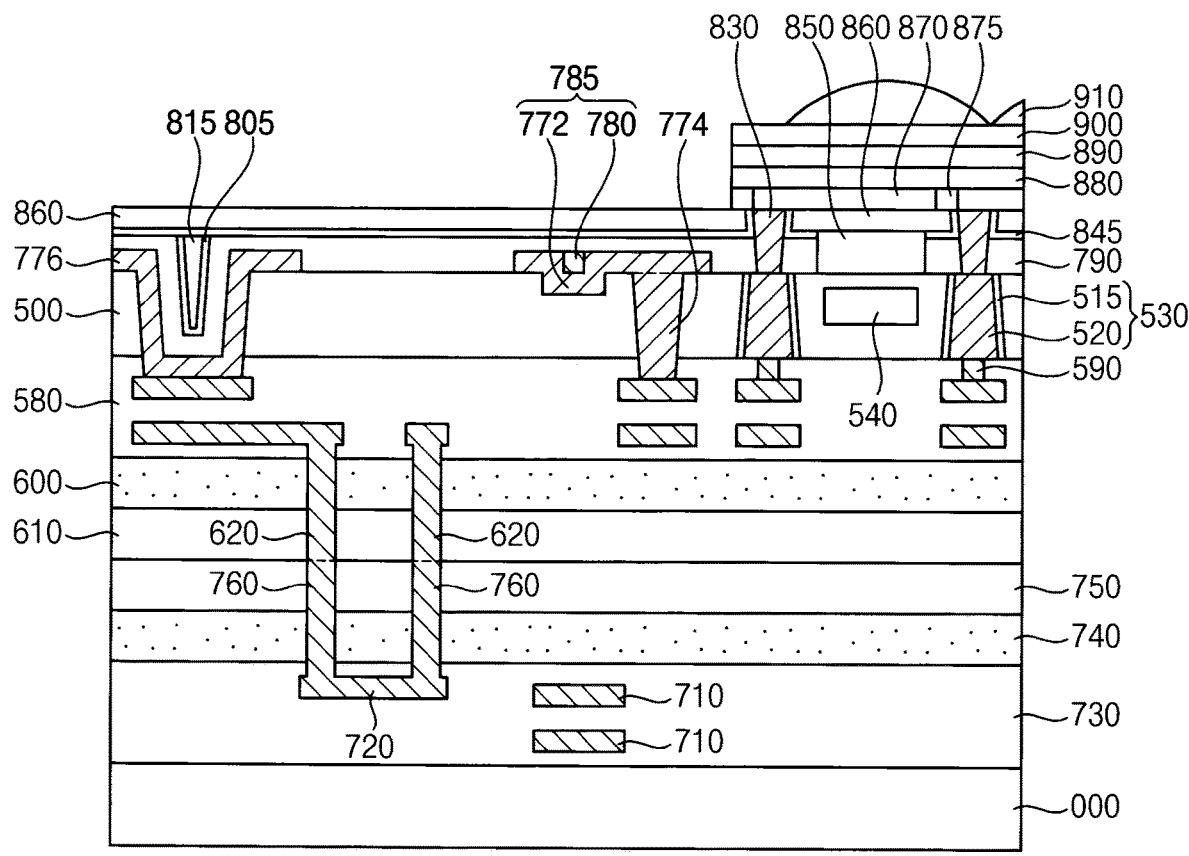
Figure 26:
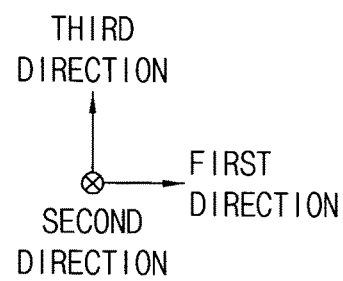

Referring to FIG. 26, a first transparent electrode 870, an organic layer 880, a second transparent electrode 890, a protective layer 900 and a microlens 910 may be stacked on the fourth insulation layer 860, the third insulation pattern 845 and the third contact plug 830 in the first region I.

According to embodiments, the first transparent electrode 870 may be formed correspondingly to each of the unit pixel regions, and may contact the upper surface of the third contact plug 830. A sidewall of the first transparent electrode 870 may be covered by a fifth insulation layer 875.

According to embodiments, the organic layer 880, the second transparent electrode 890 and the protective layer 900 may be formed over the entire first region I, and the microlens 910 may be formed correspondingly to each of the unit pixel regions. The first transparent electrode 870, the organic layer 880 and the second transparent electrode 890 stacked in the third direction may form an organic photodiode.

The first and second transparent electrodes 870 and 890 may include, e.g., indium tin oxide (ITO), indium zinc oxide (IZO), zinc oxide (ZnO), tin dioxide ($SnO_2$), antimony-doped tin oxide (ATO), antimony-doped zinc oxide (AZO), gallium-doped zinc oxide (GZO), titanium dioxide ($TiO_2$), fluorine-doped tin oxide (FTO), etc. The organic layer 880 may include an organic material in which an electron donor and an electron acceptor may be mixed with each other. For example, the organic layer 880 may include a plurality of layers in which a p-type semiconductor material and an n-type semiconductor material may form a pn-junction or a bulk hetero-junction. The protective layer 900 may include an oxide, e.g., silicon oxide.

Although not shown, upper wiring structures (not shown) may be further formed to be electrically connected to the pad 785 and the fourth via 774 in the second and third regions II and III.

As described above, the fifth and sixth adsorption layers 600 and 740 may be formed under the fifth and sixth bonding layers 610 and 750, respectively, formed on the fifth and sixth substrates 500 and 700, respectively. The fifth and sixth adsorption layers 600 and 740 may have a lower density than the fifth and sixth bonding layers 610 and 750, so that gases generated by the heat treatment process may penetrate through fifth and sixth bonding layers 610 and 750, and may be adsorbed to the fifth and sixth adsorption layers 600 and 740.

In addition, since gases of metal components trapped in an empty space between the sixth and seventh conductive patterns 620 and 760, or released as the sixth and seventh conductive patterns 620 and 760 are thermally expanded may be absorbed into the fifth and sixth adsorption layers 600 and 740, bonding strength of the fifth and sixth bonding layers 610 and 750 may be improved.

The above semiconductor device may be applied to not only complementary metal-oxide-semiconductor image sensors (CISs), but also volatile memory devices such as dynamic random access memory (DRAM) devices, non-volatile memory devices such as flash memory devices, and semiconductor packages such as high-bandwidth memories (HBMs).

As described above, although the inventive concept has been described with reference to example embodiments, those skilled in the art will readily appreciate that many modifications are possible in the example embodiments without materially departing from the novel teachings and advantages of the present inventive concept.

What is claimed is:

1. A semiconductor device comprising:
a first adsorption layer, a first bonding layer, a second bonding layer, and a second adsorption layer stacked on a first substrate; and
a conductive pattern structure penetrating through the first adsorption layer, the first bonding layer, the second bonding layer and the second adsorption layer,
wherein the first and second bonding layers are in contact with each other,
wherein each of the first and second adsorption layers includes a low-κ dielectric material, and
wherein each of the first and second adsorption layers comprises at least one air gap penetrating therethrough.

2. The semiconductor device of claim 1, wherein the low-κ dielectric material comprises at least one selected from the group consisting of SiOF (fluorous silica gel; FSG), SiCOH, hydrogen silsesquioxane (HSQ), methyl silsesquioxane (MSQ), poly(arylene ether)(PAE), polyimide, parylene-N, parylene-F, Teflon(polytetrafluoroethlene, PTFE), amorphous carbon, amorphous fluorocarbon, porous SiCOH, porous MSQ, and porous PAE.

3. The semiconductor device of claim 1, wherein each of the first and second bonding layers comprises silicon carbonitride (SiCN) or silicon oxide ($SiO_2$).

4. The semiconductor device of claim 1, wherein the first and second adsorption layers comprises a gas generated from bonding the first and second bonding layers to each other and forming the conductive pattern structure.

5. The semiconductor device of claim 3, wherein each of the first and second bonding layers comprises silicon oxide ($SiO_2$), and has a thickness of about 1000 Å or less.

6. The semiconductor device of claim 1, further comprising:
a first diffusion barrier layer under the first adsorption layer; and
a second diffusion barrier layer on the second adsorption layer.

7. The semiconductor device of claim 6, wherein a density of each of the first and second diffusion barrier layers is higher than that of each of the first and second bonding layers.

8. The semiconductor device of claim 6, further comprising a first insulating interlayer between the first substrate and the first adsorption layer, wherein the first insulating interlayer is formed of an oxide material not included in the low-κ dielectric material forming the first adsorption layer.

9. The semiconductor device of claim 8, further comprising a second insulating interlayer on the second adsorption layer, wherein each of the first and second adsorption layers has a thickness smaller than that of each of the first and second insulating interlayers.

10. The semiconductor device of claim 1, further comprising: a first insulating interlayer between the first substrate and the first adsorption layer; and a second insulating interlayer on the second adsorption layer, wherein the conductive pattern structure at least partially penetrating into each of the first and second insulating interlayers, and wherein the conductive pattern forms a continuous structure between the first adsorption layer and the first insulating interlayer without an intervening layer having a material composition different from the first insulating interlayer.

11. A semiconductor device comprising:
a first adsorption layer, a first bonding layer, a second bonding layer, and a second adsorption layer stacked on a first substrate;
a conductive pattern structure penetrating through the first adsorption layer, the first bonding layer, the second bonding layer and the second adsorption layer;
a first insulating interlayer between the first substrate and the first adsorption layer, and
a second insulating interlayer on the second adsorption layer,
wherein the first and second bonding layers are in contact with each other,
wherein each of the first and second adsorption layers includes a low-κ dielectric material, and
wherein each of the first and second insulating interlayers comprises at least one air gap penetrating therethrough.

12. A semiconductor device, comprising:
a first insulating interlayer, a first adsorption layer and a first bonding layer stacked on a substrate;
a first conductive pattern penetrating the first insulating interlayer, the first adsorption layer and the first bonding layer;
a second bonding layer, a second adsorption layer and a second insulating interlayer which are stacked on the first bonding layer; and
a second conductive pattern penetrating the second bonding layer, the second adsorption layer and the second insulating interlayer,
wherein the first and second bonding layers are in contact with each other, and the first and second conductive patterns are in contact with each other,
wherein each of the first and second adsorption layers comprises a low-κ dielectric material,
wherein the first insulating interlayer has a material composition different from the first adsorption layer, and
wherein each of the first and second adsorption layers comprises at least one air gap penetrating therethrough.

13. The semiconductor device of claim 12, wherein the low-κ dielectric material comprises at least one selected from the group consisting of SiOF (fluorous silica gel; FSG), SiCOH, hydrogen silsesquioxane (HSQ), methyl silsesquioxane (MSQ), poly(arylene ether)(PAE), polyimide, parylene-N, parylene-F, Teflon(polytetrafluoroethlene, PTFE), amorphous carbon, amorphous fluorocarbon, porous SiCOH, porous MSQ, and porous PAE.

14. The semiconductor device of claim 12, wherein each of the first and second bonding layers comprises silicon carbonitride (SiCN) or silicon oxide (SiO$_2$).

15. The semiconductor device of claim 12, further comprising:
a first diffusion barrier layer below the first adsorption layer; and
a second diffusion barrier layer on the second adsorption layer,
wherein a density of each of the first and second diffusion barrier layers is higher than that of each of the first and second bonding layers.

16. The semiconductor device of claim 12, wherein the first insulating interlayer is between the substrate and the first adsorption layer,
wherein the second insulating interlayer is on the second adsorption layer, and
wherein each of the first and second adsorption layers has a thickness smaller than that of each of the first and second insulating interlayers.

17. The semiconductor device of claim 12, wherein an upper surface of the first conductive pattern contacts a lower surface of the second conductive pattern and a lower surface of the second bonding layer.

18. A semiconductor device, comprising:
a first structure comprises a first insulating interlayer, a first diffusion barrier layer, a first adsorption layer and a first bonding layer stacked on a substrate:
a first conductive pattern penetrating through the first structure;
a second structure including a second bonding layer, a second adsorption layer, a second diffusion barrier layer and a second insulating interlayer stacked on the first structure and the first conductive pattern, and
a second conductive pattern penetrating through the second structure,
wherein the first and second bonding layers are in contact with each other, and the first and second conductive patterns are in contact with each other, and
wherein each of the first and second adsorption layers comprises a low-κ dielectric material, and further comprises at least one air gap extending therethrough.

19. The semiconductor device of claim 18, wherein a density of each of the first and second diffusion barrier layers is higher than that of each of the first and second bonding layers.

* * * * *